(12) United States Patent
Kim et al.

(10) Patent No.: US 8,324,936 B2
(45) Date of Patent: Dec. 4, 2012

(54) TRANSMITTER AND RECEIVER OF DIFFERENTIAL CURRENT DRIVING MODE, AND INTERFACE SYSTEM OF DIFFERENTIAL CURRENT DRIVING MODE INCLUDING THE SAME

(75) Inventors: Jun Ho Kim, Daejeon-si (KR); Young Soo Ryu, Goyang-si (KR); Ju Pyo Hong, Daejeon-si (KR); Jung Hwan Choi, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 0 days.

(21) Appl. No.: 13/059,021

(22) PCT Filed: Jul. 7, 2009

(86) PCT No.: PCT/KR2009/003692
§ 371 (c)(1),
(2), (4) Date: Feb. 14, 2011

(87) PCT Pub. No.: WO2010/024523
PCT Pub. Date: Mar. 4, 2010

(65) Prior Publication Data
US 2011/0304356 A1 Dec. 15, 2011

(30) Foreign Application Priority Data
Aug. 26, 2008 (KR) .................. 10-2008-0083363

(51) Int. Cl.
*H03K 19/094* (2006.01)
*H03K 19/0175* (2006.01)

(52) U.S. Cl. ............... 326/86; 326/30; 326/83; 326/127

(58) Field of Classification Search ............... 326/30, 326/83, 86, 90; 327/108, 112
See application file for complete search history.

(56) References Cited

U.S. PATENT DOCUMENTS

| | | | |
|---|---|---|---|
| 5,977,796 A * | 11/1999 | Gabara | 326/86 |
| 7,196,557 B1 * | 3/2007 | Kwasniewski et al. | 327/108 |
| 7,236,018 B1 * | 6/2007 | Wang et al. | 327/108 |
| 2008/0169847 A1 * | 7/2008 | Takenaka | 327/108 |

FOREIGN PATENT DOCUMENTS

| | | |
|---|---|---|
| JP | 2006-311446 A | 11/2006 |
| KR | 100407224 B1 | 9/2004 |
| KR | 100549157 B1 | 3/2006 |
| KR | 100588752 B1 | 6/2006 |

OTHER PUBLICATIONS

International Search Report, Appln No. PCT/KR2009/003692, dated Mar. 11, 2010.
Written Opinion of the International Searching Authority, Appln No. PCT/KR2009/003692, dated Mar. 11, 2010.

* cited by examiner

*Primary Examiner* — Anh Tran
(74) *Attorney, Agent, or Firm* — Kile Park Goekjian Reed & McManus PLLC

(57) ABSTRACT

Differential current driving type transmitter and receiver, and an interface system having the transmitter and receiver. The transmitter includes a current source, a current direction selecting block, and a balancing switch block. The current source sources currents to a pair of transmission lines or sinks currents flowing through the pair of transmission lines. The current direction selecting block transfers a current flowing from the current source to one transmission line of the pair of transmission lines and a current flowing through the other transmission line of the pair of transmission lines to the current source. The balancing switch block initializes the pair of transmission lines to a balanced state.

10 Claims, 3 Drawing Sheets

TRANSMITTER AND RECEIVER OF DIFFERENTIAL CURRENT DRIVING MODE, AND INTERFACE SYSTEM OF DIFFERENTIAL CURRENT DRIVING MODE INCLUDING THE SAME

BACKGROUND OF THE INVENTION

1. Field of the Invention

The present invention relates to a differential current driving type transmission and reception system, and more particularly, to differential current driving type transmitter and receiver which transmits and receives data in the direction of current flowing through transmission lines and a differential current driving type interface system having the transmitter and receiver.

2. Description of the Related Art

In general, a transmission-side semiconductor chip is configured to transmit voltage type signals through a unit transmission line or a pair of differential transmission lines, and a reception-side semiconductor chip is configured to sense the signals transmitted in the voltage type. In particular, in the case of the differential voltages transmitted through the pair of differential transmission lines, data is recognized using a voltage difference between the signals transmitted through two differential transmission lines. This method can be influenced by the electrical characteristics of the differential transmission lines which connect the semiconductor chips. Recently, the distance between semiconductor chips is gradually increased, and, in some new transmission methods, transmission lines have substantial impedance. Accordingly, since a time constant of a signal that is determined by the impedance of transmission lines and the capacitance between the transmission lines and a board increases, it is difficult to transmit and receive data within a short period. For this reason, the data transmission method using a voltage difference has proved inappropriate, and a current driving method for transmitting and receiving data using current has been suggested in the art.

In the current driving method, since data to be conveyed is transmitted in the type of current, a receiver restores the data from the signal transmitted in the type of current and uses restored data. The current driving method is divided into a single current driving method in which one data bit is transmitted through one transmission line, and a differential current driving method in which currents having different magnitudes are transmitted through two transmission lines and data is restored using a current difference between the two transmission lines.

In the differential current driving method, a transmitter generates currents of different magnitudes which correspond to data to be transmitted and transmits the currents through two transmission lines, and a receiver restores the data using a current difference between the currents flowing through the two transmission lines. In the differential current driving method, when compared to the single current driving method, while the distortion of transmitted signals by noise is not substantial, interference occurs between the transmission lines due to the physical positions of the two transmission lines and the parasitic resistance, parasitic inductance and parasitic capacitance of the two transmission lines.

Although two differential currents flowing from the transmitter to the receiver are based on the assumption that two current sources used for generating the two differential currents source or sink the same current value, in practice, different current values can result due to process deviations. Also, when the currents which are sourced or sunk by current sources disposed in the receiver are distorted by the noise introduced through the transmission lines, the qualities of differential current signals are degraded. Summarizing this, the transmitted signals are likely to be distorted due to interference between the two transmission lines, and the time constants of the transmission lines increase to lengthen the transient times of the signals, whereby the transmission speeds of the signals cannot but increase.

FIG. 1 is a view showing signals of a trueline, which are outputted from a transmitter of a conventional differential current driving system.

Referring to FIG. 1, when the current sources for generating the two differential currents produce current values of different magnitudes due to the above-described reasons, it is to be appreciated that the magnitudes shift by a preset deviation a, that is, an offset, each time when the directions of the currents applied to the truelines are changed.

The conventional differential current driving method and the system for realizing the method are unstable because they have the above-described problems. Therefore, novel data transmission and reception methods free from these problems are keenly demanded in the art.

SUMMARY OF THE INVENTION

Accordingly, the present invention has been made in an effort to solve the problems occurring in the related art, and an object of the present invention is to provide a differential current driving type transmitter which transmits data to a receiver by adjusting the direction of current flowing through transmission lines.

Another object of the present invention is to provide a differential current driving type transmitter which restores data transmitted from a transmitter by sensing the direction of current flowing through transmission lines.

Still another object of the present invention is to provide a differential current driving type interface system which transmits and receives data by adjusting the direction of current flowing through transmission lines.

In order to achieve the first object, according to one aspect of the present invention, there is provided a differential current driving type transmitter comprising a current source, a current direction selecting block, and a balancing switch block. The current source sources currents to a pair of transmission lines or sinks currents flowing through the pair of transmission lines. The current direction selecting block transfers a current flowing from the current source to one transmission line of the pair of transmission lines and a current flowing through the other transmission line of the pair of transmission lines to the current source. The balancing switch block initializes the pair of transmission lines to a balanced state.

In order to achieve the second object, according to another aspect of the present invention, there is provided a differential current driving type receiver comprising a far end resistor and a differential amplification section. The far end resistor has one terminal which is connected to a first transmission line and the other terminal which is connected to a second transmission line. The differential amplification section amplifies a voltage difference between both terminals of the far end resistor.

In order to achieve the third object, according to still another aspect of the present invention, there is provided a differential current driving type interface system comprising a transmitter and a receiver connected with the transmitter via two transmission lines. The transmitter adjusts the directions of currents flowing through two transmission lines depending upon data to be transmitted, and the receiver restores data by sensing the directions of the currents flowing through the two transmission lines.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
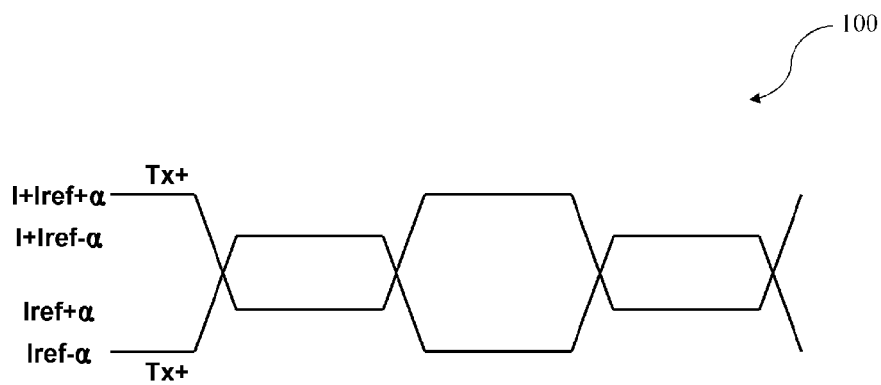
FIG. 1 is a view showing signals of a trueline, which are outputted from a transmitter of a conventional differential current driving system.

Reference will now be made in greater detail to preferred embodiments of the invention, examples of which are illustrated in the accompanying drawings. Wherever possible, the same reference numerals will be used throughout the drawings and the description to refer to the same or like parts.

Figure 2:
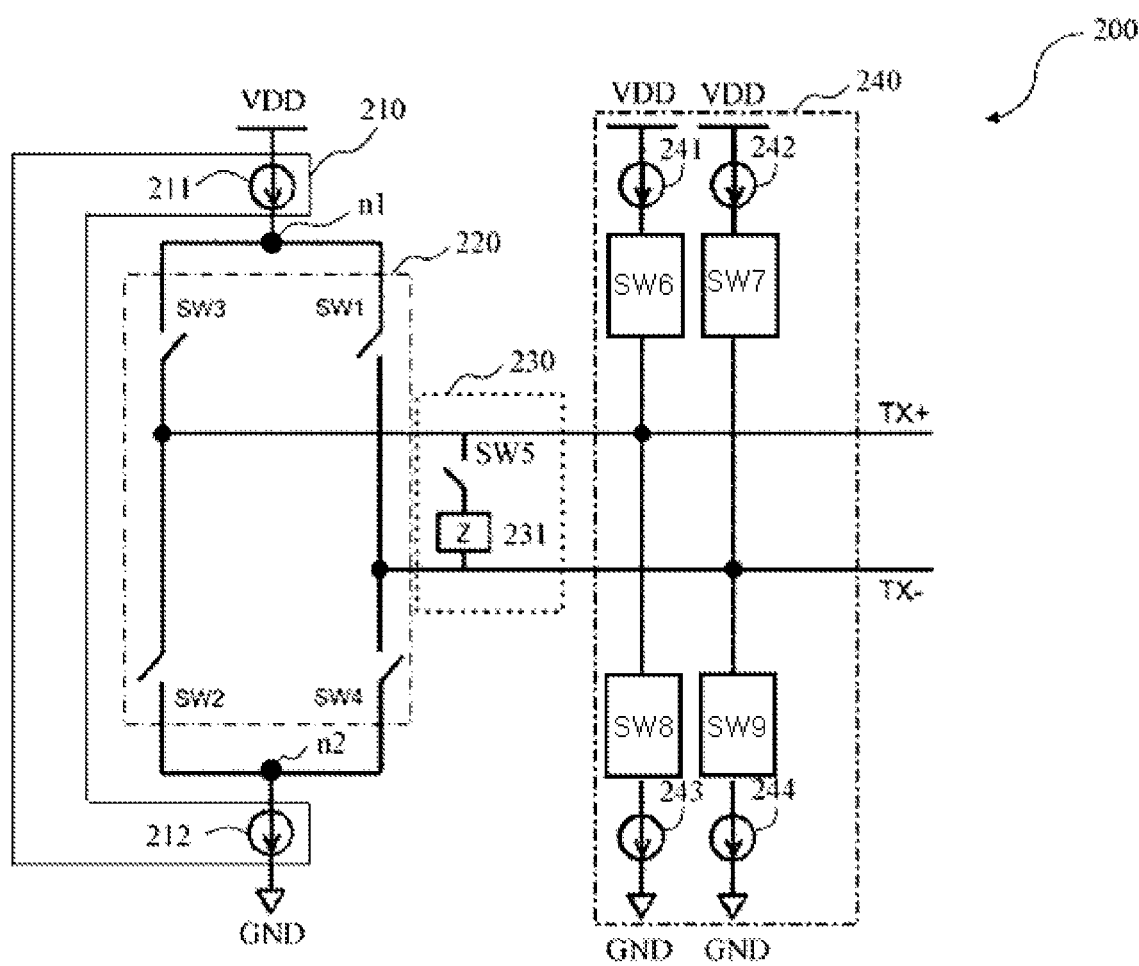
FIG. 2 is a circuit diagram of a differential current driving type transmitter in accordance with an embodiment of the present invention.

FIG. 2 is a circuit diagram of a differential current driving type transmitter in accordance with an embodiment of the present invention.

Referring to FIG. 2, a differential current driving type transmitter 200 includes a current source 210, a current direction selecting block 220, a balancing switch block 230, and a pre-emphasis circuit 240.

The current source 210 comprises two current sources 211 and 212 which supply currents to a pair of transmission lines TX+ and TX− or sink the currents flowing through the pair of transmission lines TX+ and TX−. A current supply source 211 has one terminal which is connected to a first voltage VDD and the other terminal which is connected to a first terminal n1 of the current direction selecting block 210, and supplies current of a preset magnitude to the first terminal n1. A current sink 212 has one terminal which is connected to a second voltage GND and the other terminal which is connected to a second terminal n2 of the current direction selecting block 210, and supplies current of a preselected magnitude from the second terminal n2 to the second voltage GND. It is the norm that the magnitude of the current supplied from the current supply source 211 is the same as that of the current sunk to the current sink 212 and the voltage level of the first voltage VDD is higher than the voltage level of the second voltage GND.

The current direction selecting block 220 transfers the current flowing from the current source 210 to one transmission line of the pair of transmission lines TX+ and TX− and the current flowing through the other transmission line of the pair of transmission lines TX+ and TX− to the current source 210, and has four selection switches SW1 through SW4. The first selection switch SW1 has one terminal which is connected to the first terminal n1 and the other terminal which is connected to the second transmission line TX−. The second selection switch SW2 has one terminal which is connected to the second terminal n2 and the other terminal which is connected to the first transmission line TX+. The third selection switch SW3 has one terminal which is connected to the first terminal n1 and the other terminal which is connected to the first transmission line TX+. The fourth selection switch SW4 has one terminal which is connected to the second terminal n2 and the other terminal which is connected to the second transmission line TX−.

The pair of the first selection switch SW1 and second selection switch SW2 and the pair of the third selection switch SW3 and fourth selection switch SW4 are simultaneously turned on or off. The turn-on and turn-off operations of the pair of the first selection switch SW1 and second selection switch SW2 are opposite to the turn-on and turn-off operations of the pair of the third selection switch SW3 and fourth selection switch SW4. That is to say, if the pair of the first selection switch SW1 and second selection switch SW2 are turned on, the pair of the third selection switch SW3 and fourth selection switch SW4 are turned off. Conversely, if the pair of the third selection switch SW3 and fourth selection switch SW4 are turned on, the pair of the first selection switch SW1 and second selection switch SW2 are turned off.

The balancing switch block 230 initializes the pair of transmission lines TX+ and TX− to a balanced state, and has a balancing switch SW5 and a resistor component 231. The balancing switch SW5 has one terminal which is connected to the first transmission line TX+ and the other terminal which is connected to the second transmission line TX−. The resistor component 231 is disposed between the balancing switch SW5 and the second transmission line TX−. While the resistor component 231 is disposed between the second transmission line TX− and the balancing switch SW5 in FIG. 2, it can be envisaged that the resistor component 231 can be disposed between the first transmission line TX+ and the balancing switch SW5. Also, the size of the resistor component 231 can be adjusted from the outside (not shown).

The pre-emphasis circuit 240 supplies or sinks currents of predefined magnitudes to the pair of transmission lines TX+ and TX− before supplying currents from the current source 210 to the pair of transmission lines TX+ and TX− or sinking the currents flowing through the pair of transmission lines TX+ and TX−.

The pre-emphasis circuit 240 includes four current sources 241 through 244 and four switches SW6 through SW9.

A second current supply source 241 has one terminal which is connected to the first voltage VDD. A third current supply source 242 has one terminal which is connected to the first voltage VDD. The second current sink 243 has one terminal which is connected to the second voltage GND. The third current sink 244 has one terminal which is connected to the second voltage GND.

The sixth switch SW6 has one terminal which is connected to the other terminal of the second current supply source 241 and the other terminal which is connected to the first transmission line TX+. The seventh switch SW7 has one terminal which is connected to the other terminal of the third current supply source 242 and the other terminal which is connected to the second transmission line TX−. The eighth switch SW8 has one terminal which is connected to the other terminal of the second current sink 243 and the other terminal which is connected to the first transmission line TX+. The ninth switch SW9 has one terminal which is connected to the other terminal of the third current sink 244 and the other terminal which is connected to the second transmission line TX−.

It is preferred that the turn-on and turn-off cycles and the turn-on resistance values of the switches SW1 through SW4 constituting the current direction selecting block 220 and the switches SW6 through SW9 constituting the pre-emphasis circuit 240 be designed to be different depending upon a system to be used.

Hereafter, the operation of the transmitter 200 shown in FIG. 2 will be described.

The key idea of the present invention resides in that the type of data to be transmitted is determined by the directions of currents flowing through the two transmission lines TX+ and TX−.

When it is necessary to flow current from the first transmission line TX+ to the second transmission line TX−, the third selection switch SW3 and the fourth selection switch SW4 are turned on, and the first selection switch SW1 and the second selection switch SW2 are turned off. Conversely, when it is necessary to flow current from the second transmission line TX− to the first transmission line TX+, the first selection switch SW1 and the second selection switch SW2 are turned on, and the third selection switch SW3 and the fourth selection switch SW4 are turned off.

In the present invention, the pre-emphasis circuit 240 is used to increase a data transmission speed. When current is supplied to the first transmission line TX+ and current is sunk from the second transmission line TX− in the current direction selecting block 220, the sixth switch SW6 is turned on and initial current is supplied to the first transmission line TX+. In order to further increase the speed, the ninth switch SW9 is turned on and the initial current is sunk from the second transmission line TX−. Conversely, when current is supplied to the second transmission line TX− and current is sunk from the first transmission line TX+ in the current direction selecting block 220, the seventh switch SW7 is turned on and initial current is supplied to the second transmission line TX−, and the eighth switch SW9 is additionally turned on and the initial current is sunk from the first transmission line TX+.

In the present invention, in the balancing switch block 230, in addition to the balancing switch SW5 which is used to initialize the pair of transmission lines TX+ and TX− to a balanced state, the resistor component 231 is used. This is to suppress electromagnetic interference that can occur at the moment when the pair of transmission lines TX+ and TX− go to the balanced state.

Figure 3:
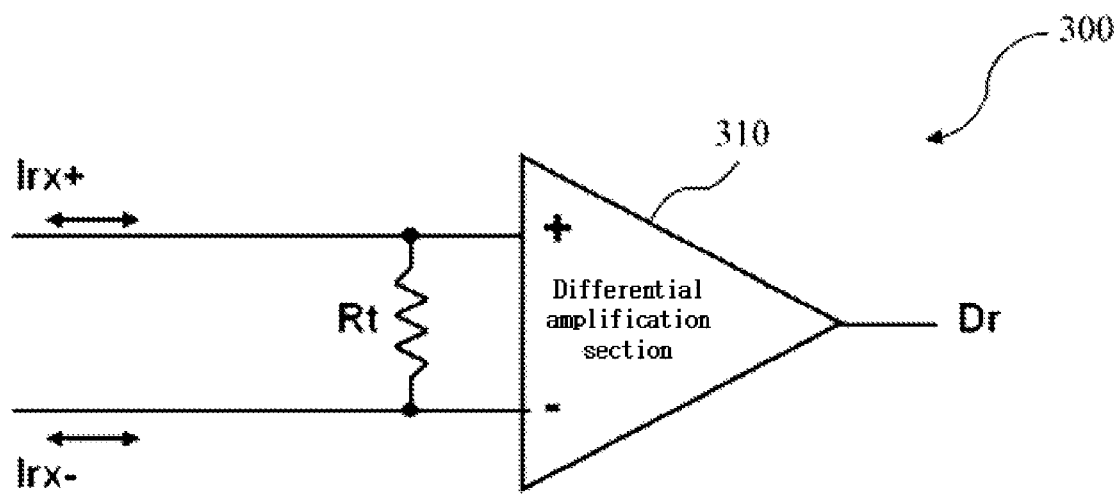
FIG. 3 is a circuit diagram of a differential current driving type receiver in accordance with another embodiment of the present invention.

FIG. 3 is a circuit diagram of a differential current driving type receiver in accordance with another embodiment of the present invention.

Referring to FIG. 3, a differential current driving type receiver 330 includes a far end resistor Rt and a differential amplification section 310. The far end resistor Rt has one terminal which is connected to the first transmission line TX+ and the other terminal which is connected to the second transmission line TX−. The differential amplification section 310 amplifies a voltage difference between both terminals of the far end resistor Rt. The current flowing between the two transmission lines TX+ and TX− passes through the far end resistor Rt, and the voltages dropping at both terminals of the far end resistor Rt are different depending upon current flowing directions. Because the voltage difference dropping at both terminals of the far end resistor Rt is very small, it is preferred that the voltage difference be amplified by the differential amplification section 310. While numerous function blocks are actually employed in the differential current driving type receiver 300 shown in FIG. 3, only a minimum circuit used for sensing differential current signals Irx+ and Irx− received through the two transmission lines TX+ and TX− is illustrated.

As describe above, the differential current signals transmitted from the transmitter 200 can be extremely simply sensed by the receiver 300. Since the current flowing directions are used for restoration of data, the electrical characteristics of the transmission lines do not exert any influence on the restoration of the data. Accordingly, the problems caused in the conventional differential current driving method do not exert any influence on the present invention.

While three current sources (not shown) are employed in the conventional transmitter (not shown), only the two current sources 211 and 212 are employed in the transmitter 200 according to the present invention. Due to this fact, power consumption can be reduced compared to the conventional art.

Figure 4:
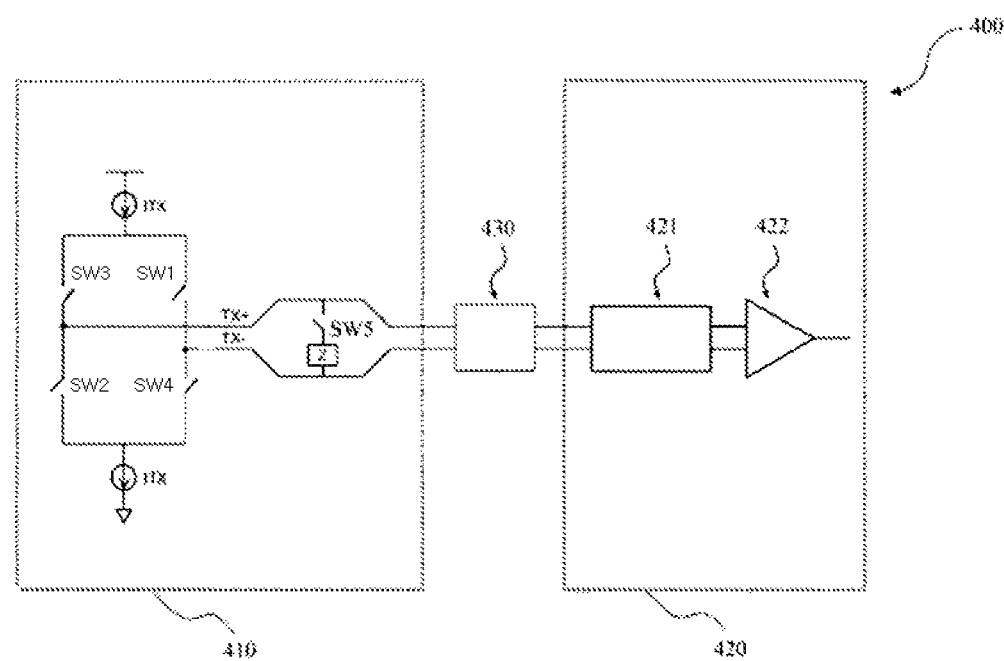
FIG. 4 is a circuit diagram of a differential current driving type interface system in accordance with still another embodiment of the present invention.

FIG. 4 is a circuit diagram of a differential current driving type interface system in accordance with still another embodiment of the present invention.

Referring to FIG. 4, a differential current driving type interface system 400 includes a transmitter 410, a receiver 420, and transmission lines 430.

Two transmission lines 430 are disposed between the transmitter 410 and the receiver 420. The transmitter 410 adjusts the directions of currents to be flowed through the two transmission lines depending upon data to be transmitted, and the receiver 420 restores the data by sensing the directions of the currents flowing through the two transmission lines. Thus, it is preferred that the direction of the current flowing through one transmission line of the two transmission lines be opposite to the direction of the current flowing through the other transmission line of the two transmission lines and the magnitudes of the currents flowing through the two transmission lines be the same.

Since the transmitter 410 and the receiver 420 shown in FIG. 4 correspond to the transmitter 200 and the receiver 300 shown in FIGS. 2 and 3, the detailed description thereof will be omitted herein.

Figure 5:
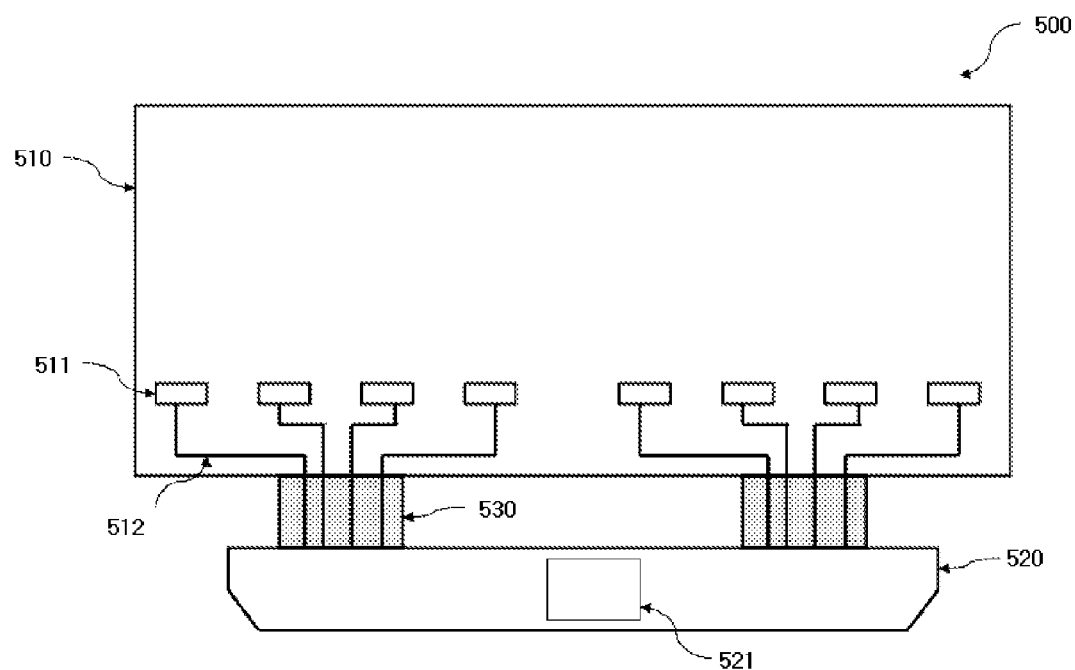
FIG. 5 is a view illustrating a display panel driving system in accordance with a still further embodiment of the present invention, in which the differential current driving type interface system according to the present invention is realized.

FIG. 5 is a view illustrating a display panel driving system in accordance with a still further embodiment of the present invention, in which the differential current driving type interface system according to the present invention is realized.

Referring to FIG. 5, a display panel driving system 500 includes a display panel 510 and a PCB (printed circuit board) 520 which are connected with each other by an FPC (flexible printed circuit) 530.

A plurality of pixels (not shown), which are driven by a plurality of column driver ICs 511, are two-dimensionally disposed in the display panel 510. The plurality of column driver ICs 511 operate in response to control signals received from a timing controller 521 which is connected thereto via the FPC 530 and LOGs (lines on glass) 512. The timing controller 521 is installed on the PCB 520.

While the LOGs 512 are based on the assumption that the display panel 510 is formed on glass, it is to be noted that a different design can be adopted depending upon the material of the display panel 510.

Referring to FIG. 5, due to the fact that the plurality of column driver ICs 511 are installed in the horizontal direction, EMI (electromagnetic interference) can occur when they are simultaneously operated. In this regard, the timing controller 521 does not simultaneously but sequentially activate the plurality of column driver ICs 511, whereby it is possible to avoid EMI.

Figure 6:
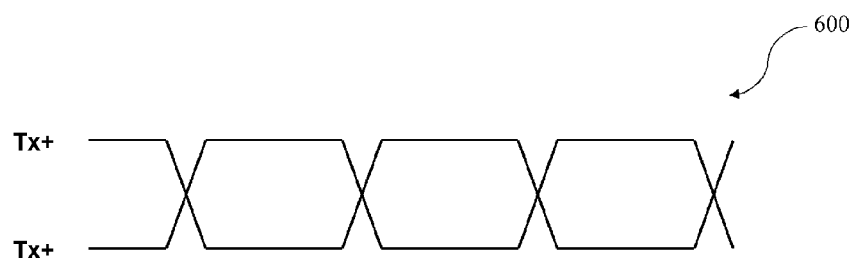
FIG. 6 is a view showing signals of a first transmission line (trueline), which are outputted from the differential current driving type transmitter according to the present invention.

FIG. 6 is a view showing signals of a first transmission line (trueline), which are outputted from the differential current driving type transmitter according to the present invention.

Referring to FIG. 6, since the signal sensed from the first transmission line (trueline) TX+ is not influenced by an offset, it is to be understood that the magnitude of the signal does not vary even when the direction of the current is changed.

As described above, in the case of the system according to the present invention, because a signal path is unified and the far end resistor Rt is built in the receiver 300, it is possible to solve the problems caused in the conventional art due to the fact that noise generated in any one of the transmitter and receiver is reflected on the signal of the other of the transmitter and receiver so that common noise results. Also, a change in the magnitude of the VID (voltage of input difference) can be suppressed to the minimum due to the use of the balancing switch block 230, and the data transmission speed can be improved due to the use of the pre-emphasis circuit 240.

As is apparent from the above description, the present invention provides advantages in that, since data is transmitted and received by adjusting the direction of current flowing through transmission lines, transmission and reception circuits are simplified so that power consumption is reduced, and the transmission and reception of the data is not influenced by the electrical characteristics of the transmission lines.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A differential current driving type transmitter comprising:
    a current source configured to source currents to a pair of transmission lines and sink currents flowing through the pair of transmission lines;
    a current direction selecting block configured to transfer a current flowing from the current source to a first transmission line of the pair of transmission lines and a current flowing through a second transmission line of the pair of transmission lines to the current source;
    a balancing switch block configured to initialize the pair of transmission lines to a balanced state,
    wherein the current source comprises a current supply source which has one terminal connected to a first voltage and the other terminal connected to a first terminal of the current direction selecting block, and a current sink which has one terminal connected to a second voltage and the other terminal connected to a second terminal of the current direction selecting block,
    wherein the balancing switch block comprises a balancing switch which has one terminal connected to the first transmission line and the other terminal connected to the second transmission line and a resistor component which is disposed between the second transmission line and the balancing switch, a value of the resistor component capable of being changed, and
    wherein the transmitter further comprises a pre-emphasis circuit comprising:
        a second current supply source connected to the first voltage, a third current supply source connected to the first voltage, a second current sink connected to the second voltage, a third current sink connected to the second voltage, a sixth switch, a seventh switch, an eighth switch, and a ninth switch,
    wherein the sixth switch and the eighth switch are connected to the first transmission line, and wherein the sixth switch and the eighth switch are positioned on the same line between the second current supply source and the second current sink,
    wherein the seventh switch and the ninth switch are connected to the second transmission line, and wherein the seventh switch and the ninth switch are positioned on the same line between the third current supply source and the third current sink, and
    wherein the sixth switch and the ninth switch, or the seventh switch and the eighth switch, can be simultaneously opened to increase a data transmission speed of the transmitter.

2. The transmitter according to claim 1, wherein the current direction selecting block comprises:
    a first selection switch having one terminal which is connected to the first terminal and the other terminal which is connected to the second transmission line;
    a second selection switch having one terminal which is connected to the second terminal and the other terminal which is connected to the first transmission line;
    a third selection switch having one terminal which is connected to the first terminal and the other terminal which is connected to the first transmission line; and
    a fourth selection switch having one terminal which is connected to the second terminal and the other terminal which is connected to the second transmission line.

3. The transmitter according to claim 2,
    wherein a pair of the first selection switch and second selection switch and a pair of the third selection switch and fourth selection switch are simultaneously turned on or off; and
    wherein turn-on and turn-off operations of the pair of the first selection switch and second selection switch are opposite to turn-on and turn-off operations of the pair of the third selection switch and fourth selection switch.

4. The transmitter according to claim 1,
    wherein the pre-emphasis circuit is configured to supply or sink currents of predefined magnitudes to the pair of transmission lines before supplying currents from the current source to the pair of transmission lines or sinking currents flowing through the pair of transmission lines.

5. The transmitter according to claim 1,
    wherein, when it is necessary to source a current to the first transmission line and sink a current from the second transmission line in the current direction selecting block, the sixth switch is turned on and an initial current is sourced to the first transmission line; and
    wherein, when it is necessary to source a current to the second transmission line and sink a current from the first transmission line in the current direction selecting block, the seventh switch is turned on and an initial current is sourced to the second transmission line.

6. The transmitter according to claim 1,
    wherein, when it is necessary to source a current to the first transmission line and sink a current from the second transmission line in the current direction selecting block, the ninth switch is turned on and an initial current is sunk from the second transmission line; and
    wherein, when it is necessary to source a current to the second transmission line and sink a current from the first transmission line in the current direction selecting block, the eighth switch is turned on and an initial current is sunk from the first transmission line.

7. A differential current driving type interface system comprising:
- a transmitter configured to adjust directions of currents flowing through two transmission lines depending upon data to be transmitted; and
- a receiver connected with the transmitter via the two transmission lines, configured to restore data by sensing the directions of the currents flowing through the two transmission lines, and having a far end resistor having one terminal which is connected to a first transmission line and the other terminal which is connected to a second transmission line and a differential amplification section which amplifies a voltage difference between both terminals of the far end resistor, wherein the transmitter comprises:
- a current source configured to source currents to the two transmission lines and sink currents flowing through the two transmission lines;
- a current direction selecting block configured to transfer a current flowing from the current source to a first transmission line of the two transmission lines and a current flowing through a second transmission line of the two transmission lines to the current source;
- a balancing switch block configured to initialize the two transmission lines to a balanced state, and having a balancing switch which has one terminal connected to the first transmission line and the other terminal connected to the second transmission line and a resistor component which is disposed between the second transmission line and the balancing switch, a value of the resistor component capable of being changed; and
- a pre-emphasis circuit positioned between the balancing switch block of the transmitter and the receiver, the pre-emphasis circuit comprising:
  - a second current supply source connected to a first voltage, a third current supply source connected to the first voltage, a second current sink connected to a second voltage, a third current sink connected to the second voltage, a sixth switch, a seventh switch, an eighth switch, and a ninth switch,
  - wherein the sixth switch and the eighth switch are connected to the first transmission line, and wherein the sixth switch and the eighth switch are positioned on the same line between the second current supply source and the second current sink,
  - wherein the seventh switch and the ninth switch are connected to the second transmission line, and wherein the seventh switch and the ninth switch are positioned on the same line between the third current supply source and the third current sink, and
  - wherein the sixth switch and the ninth switch, or the seventh switch and the eighth switch, can be simultaneously opened to increase a data transmission speed of the transmitter.

8. The interface system according to claim 7, wherein a direction of a current flowing through one transmission line of the two transmission lines is opposite to a direction of a current flowing through the other transmission line of the two transmission lines.

9. The interface system according to claim 7, wherein magnitudes of the currents flowing through the two transmission lines are the same.

10. The interface system according to claim 7, wherein the receiver comprises the far end resistor which is connected between the two transmission lines, and restores data by amplifying a difference between voltages of both terminals of the far end resistor that drop in correspondence to the currents flowing through the two transmission lines.

* * * * *